United States Patent
Lee

(10) Patent No.: US 6,710,404 B2
(45) Date of Patent: Mar. 23, 2004

(54) HIGH VOLTAGE DEVICE AND METHOD FOR FABRICATING THE SAME

(75) Inventor: Da Soon Lee, Kyonggi-do (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/401,790

(22) Filed: Mar. 31, 2003

(65) Prior Publication Data

US 2003/0201510 A1 Oct. 30, 2003

Related U.S. Application Data

(62) Division of application No. 10/132,407, filed on Apr. 26, 2002, now Pat. No. 6,638,825.

(30) Foreign Application Priority Data

Apr. 28, 2001 (KR) ...................................... P2001-23182

(51) Int. Cl.⁷ .............................................. H01L 29/76
(52) U.S. Cl. ...................... 257/330; 257/335; 257/339; 257/341; 257/409; 257/491; 257/500
(58) Field of Search ................................ 257/488, 491, 257/496, 500, 302, 328, 329, 330, 332, 335, 339, 341, 409

(56) References Cited

U.S. PATENT DOCUMENTS

| | | |
|---|---|---|
| 5,460,989 A | 10/1995 | Wake |
| 6,461,918 B1 | 10/2002 | Calafut |
| 6,469,345 B2 | 10/2002 | Aoki et al. |

OTHER PUBLICATIONS

Z. Parpia et al., "Optimization of Resurfldmos Transistors: An Analytical Approach", IEEE Transactions of Electron Devices, vol. 37, No. 3, pp. 789–796, (Mar. 1990).
Z. Parpia et al., "A Novel CMOS–Compatible High–Voltage Transistor Structure", Reprinted from IEEE Trans. Electron Devices, vol. ED–33, No. 12, pp. 1948–1952, (Dec. 1996).

*Primary Examiner*—Jack Chen
(74) *Attorney, Agent, or Firm*—Finnegan, Henderson, Farabow, Garrett & Dunner, L.L.P.

(57) ABSTRACT

A high voltage device and a method for fabricating the same are disclosed, which improves voltage-resistant characteristics to protect against high voltage applied to a gate electrode. The high voltage device includes a semiconductor substrate having first, second and third regions, the first region having sidewalls at both sides, and the second and third regions having a height higher than that of the first region at both sides of the first region. A channel region is formed within a surface of the substrate belonging to the first region including some of the sidewalls. A first insulating film is formed on a surface of the first region including the sidewalls. Buffer conductive films are formed to be adjacent to the sidewalls of the first region and isolated from each other. A second insulating film is formed between the buffer conductive films to have a recess portion. A third insulating film is formed on an entire surface including the buffer conductive films. A gate electrode, insulated from lower layers by the third insulating film to fill the recess portion, is formed to partially overlap the buffer conductive films. Drift regions are respectively formed in the second and third regions to have a first depth, and source and drain regions are formed in the second and third regions to have a second depth less than the first depth.

6 Claims, 9 Drawing Sheets

HIGH VOLTAGE DEVICE AND METHOD FOR FABRICATING THE SAME

CROSS-REFERENCE TO RELATED APPLICATION

This is a division of application Ser. No. 10/132,407, filed Apr. 26, 2002 which is incorporated in its entirety herein by reference. Now U.S. Pat. No. 6,638,825.

This application claims benefit of priority under 35 U.S.C. § 119 to Korean Application Serial No. 2001-23182 filed Apr. 28, 2001, the entire contents of which are incorporated by reference herein.

FIELD OF THE INVENTION

The present invention relates to semiconductor devices and methods for fabricating the same, more particularly, to high voltage devices and methods for fabricating the same that improves voltage-resistant characteristics when high voltage is applied to a gate electrode.

Background of the Invention

Generally, where an external system which employs a high voltage is controlled by an integrated circuit, the integrated circuit requires a device for controlling the high voltage. The device requires a structure having a high breakdown voltage.

In other words, for a drain or source of a transistor to which high voltage is directly applied, the punch-through voltage between the drain, source, and semiconductor substrate and the breakdown voltage between the drain, source, and well or substrate should be greater than the high voltage.

A double-diffused metal oxide semiconductor (DMOS) having a PN diode therein is generally used as a semiconductor device for high voltages. In this case, a drain region is formed as a double impurity diffused region so that the punch-through voltage and the breakdown voltage of the transistor become high while a PN diode is formed between the source and drain to prevent the device from being broken down by overvoltage when the transistor is turned off.

A known high voltage device and a method for fabricating the same will be described with reference to the accompanying drawings.

FIG. 1 is a sectional view illustrating a high voltage device known in the art, and FIG. 2 is a sectional view illustrating another high voltage device known in the art.

Examples of high voltage devices include a lateral diffused metal oxide semiconductor (LDMOS) transistor and a double diffused drain (DDD) MOS transistor.

FIG. 1 shows an LDMOS transistor. The LDMOS transistor includes an n-type semiconductor substrate 11, a p-type well 12, a drain region 13, a source region 14, a gate oxide film 15, a gate electrode 16, a drain contact 17, and a source contact 18. P-type well 12 is formed in a predetermined portion of semiconductor substrate 11. Drain region 13 is formed as an n-type heavily-doped impurity layer in one region within p-type well 12 at a predetermined depth. Source region 14 is formed as an n-type heavily-doped impurity layer in one region of semiconductor substrate 11 at a predetermined distance from p-type well 12. Gate oxide film 15 is formed having a first thickness on drain region 13, p-type well 12, and semiconductor substrate 11 adjacent to p-type well 12. Gate oxide film 15 is also formed having a second thickness greater than the first thickness on source region 14 and semiconductor substrate 11 adjacent to source region 14. Gate electrode 16 is formed on a predetermined region of gate oxide film 15 at a predetermined distance from source region 14 and overlaps drain region 13 and p-type well 12 adjacent to drain region 13 at an upper portion. Drain contact 17 and source contact 18 are in respective contact with drain region 13 and source region 14 through gate oxide film 15.

FIG. 2 shows a high voltage transistor having a DDD structure. The high voltage transistor having a DDD structure includes a p-type substrate 21, a gate oxide film 25, a gate electrode 26, an n-type drift region 22, an n-type heavily-doped drain region 23, an n-type heavily-doped source region 24, a drain contact 27, and a source contact 28. Gate oxide film 25 is formed on p-type substrate 21. Gate electrode 26 is formed in a predetermined portion on gate oxide film 25. N-type drift region 22 is formed in semiconductor substrate 21 at both sides below gate electrode 26 at a predetermined depth, partially overlapping gate electrode 26 at a lower portion of an edge of gate electrode 26. N-type heavily-doped drain region 23 is formed within drift region 22 at one side of gate electrode 26. N-type heavily-doped source region 24 is formed within drift region 22 at the other side of gate electrode 26. Drain contact 27 and source contact 28 are in respective contact with drain region 23 and source region 24 through gate oxide film 25.

In known high voltage devices, to improve voltage-resistant characteristics, the distance between the edge portion of the gate electrode and the heavily-doped source and drain regions, i.e., the traverse length of the drift region is increased. However, with increases in packing density of the semiconductor device, the drift region has a reduced length. This deteriorates voltage-resistant characteristics of the high voltage device.

SUMMARY OF THE INVENTION

Accordingly, the present invention is directed to high voltage devices and method for fabricating the same. The present invention provides a high voltage device and a method for fabricating the same that improves voltage-resistant characteristics and reduces the size of a device in order to improve packing density.

In accordance with the invention, a high voltage device includes a semiconductor substrate having first, second, and third regions, the first region having vertical sidewalls at both sides, and the second and third regions having a height higher than that of the first region at both sides of the first region. A channel region is formed within a surface of the substrate belonging to the first region including some of the vertical sidewalls. A first insulating film is formed on a surface of the first region including the vertical sidewalls. Buffer conductive films are formed to be adjacent to the sidewalls of the first region and isolated from each other. A second insulating film is formed between the buffer conductive films to have a recess portion. A third insulating film is formed on an entire surface including the buffer conductive films. A gate electrode, insulated from lower layers by the third insulating film to fill the recess portion, is formed to partially overlap the buffer conductive films. Drift regions respectively are formed in the second and third regions to have a first depth, and source and drain regions are formed in the second and third regions to have a second depth less than the first depth.

In another aspect of the present invention, a method for fabricating a high voltage device includes the steps of forming drift regions in a semiconductor substrate, forming source and drain ion injection regions within the drift regions, forming a trench greater than the drift regions in one region of the semiconductor substrate, forming a first insulating film on an entire surface including the trench, forming a first conductive film on the first insulating film, selectively removing the first conductive film to form buffer conductive films at both sides of the trench, forming a second insulating film having a predetermined thickness below the trench, forming a third insulating film on the entire surface including the buffer conductive films, forming a second conductive film on the third insulating film, and selectively removing the second conductive film and the third insulating film to form a gate electrode on the trench and the buffer conductive films adjacent to the trench.

Additional advantages and features of the invention will be set forth in part in the description which follows and in part will become apparent to those having ordinary skill in the art upon examination of the following or may be learned from practice of the invention. The advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiments of the invention and, together with the description, serve to explain the principles of the invention. In the drawings.

DESCRIPTION OF THE EMBODIMENTS

Reference will now be made in detail to the embodiments of the present invention, examples of which are illustrated in the accompanying drawings.

Figure 1:
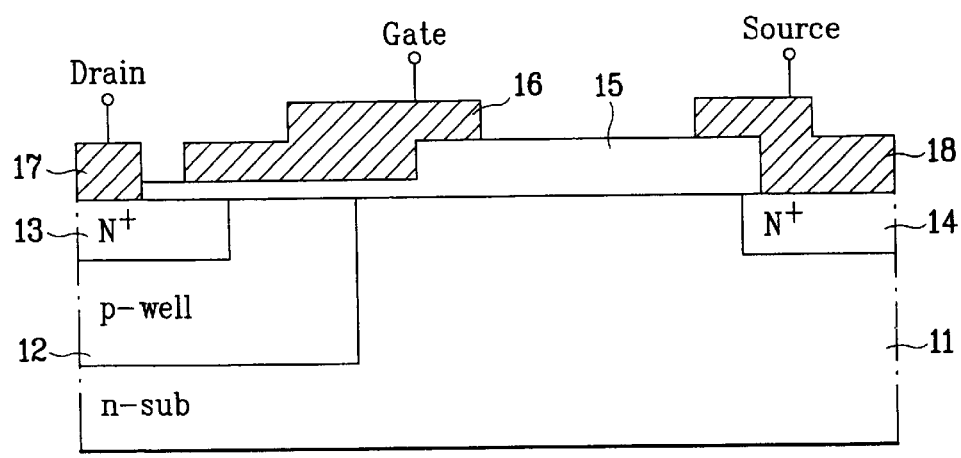
FIG. 1 is a sectional view illustrating a known high voltage device.
Figure 2:
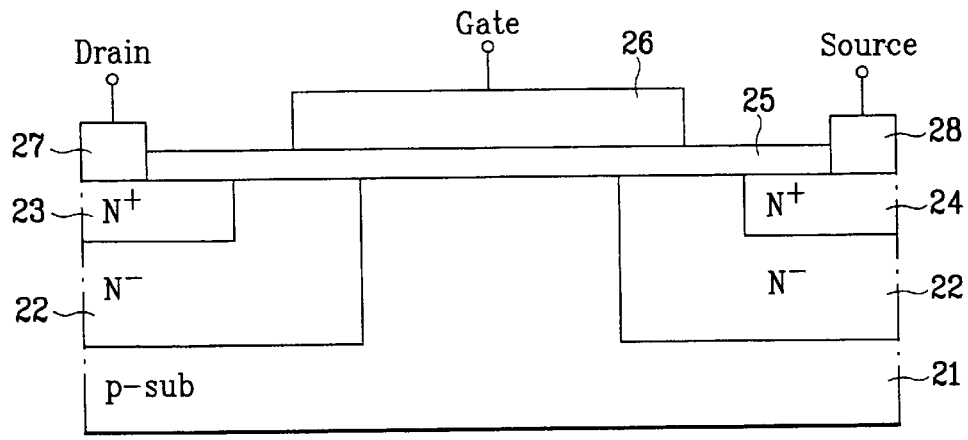
FIG. 2 is a sectional view illustrating another known high voltage device.
Figure 3A:
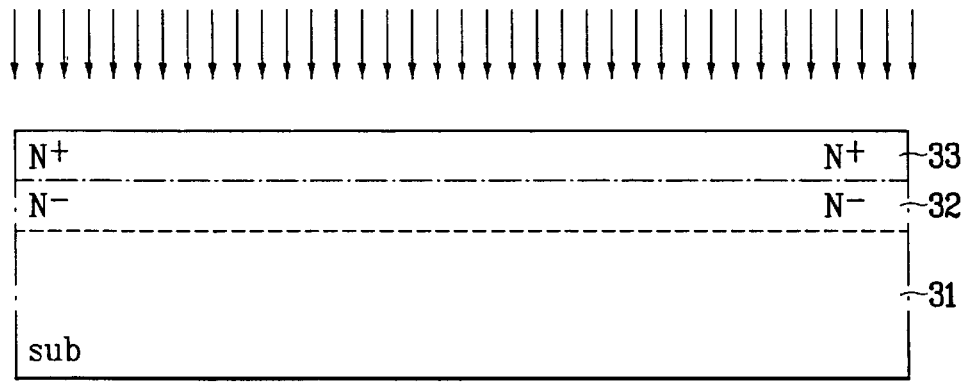
FIGS. 3A to 3P are sectional views illustrating steps for making a high voltage device according to the present invention.
Figure 3B:
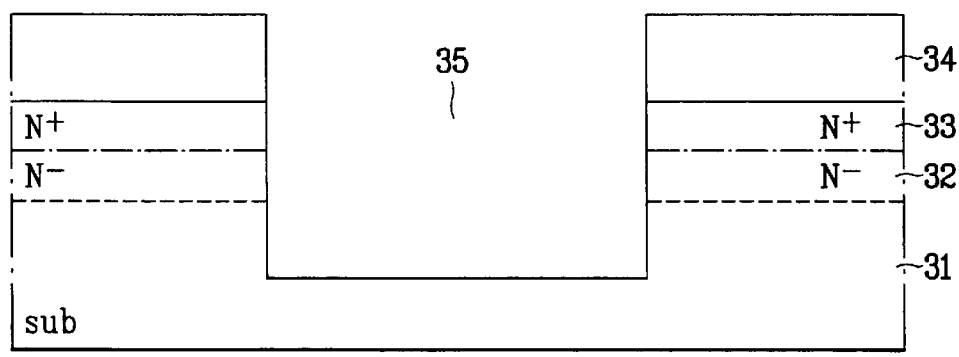
Figure 3C:
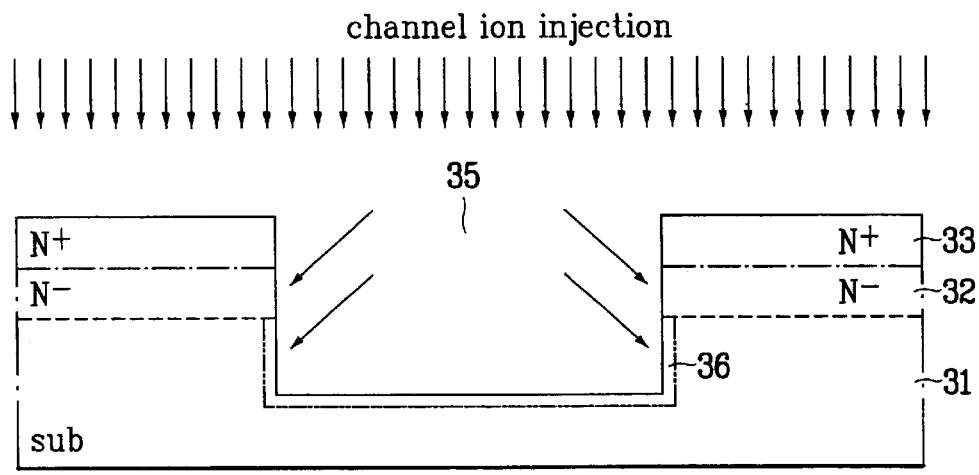
Figure 3D:
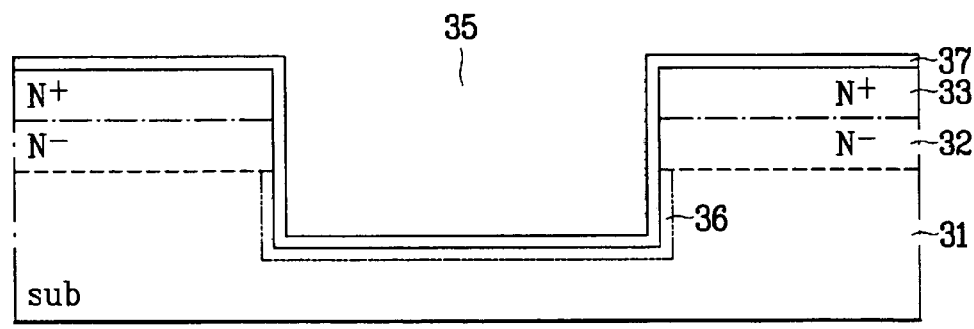
Figure 3E:
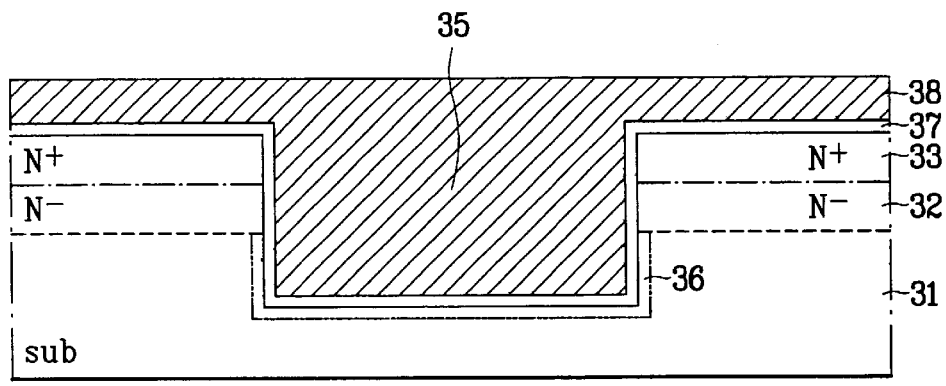
Figure 3F:
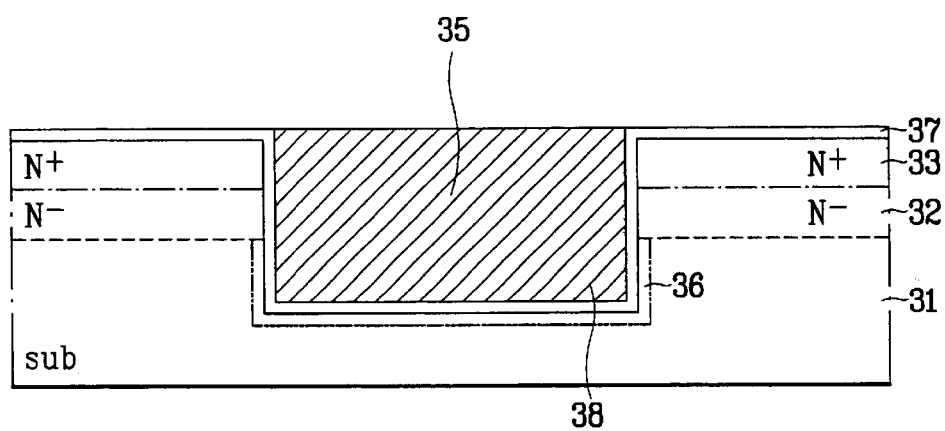
Figure 3G:
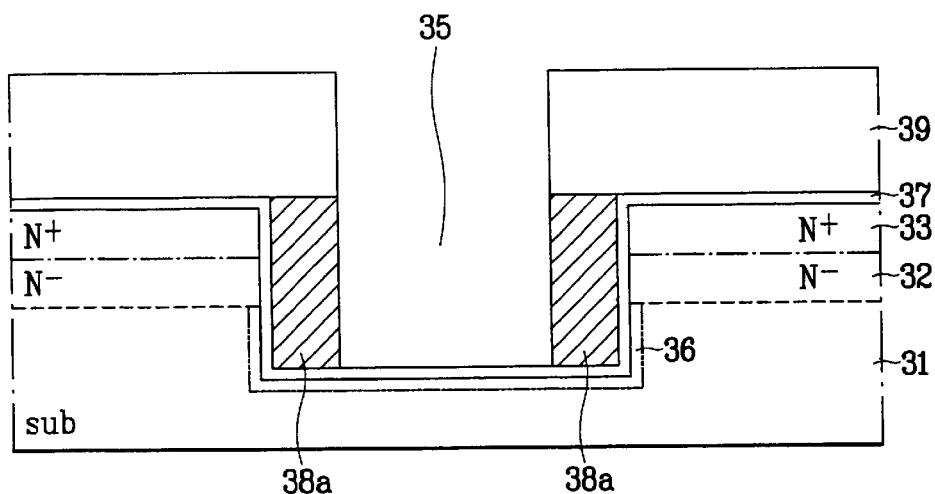
Figure 3H:
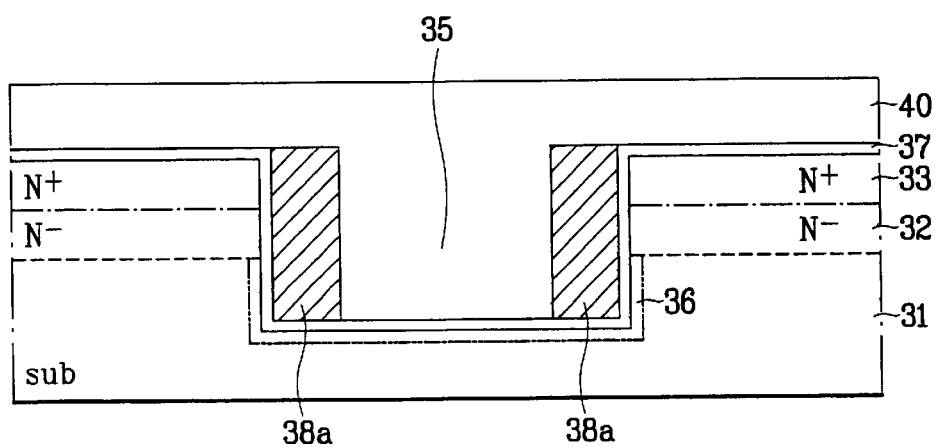
Figure 3I:
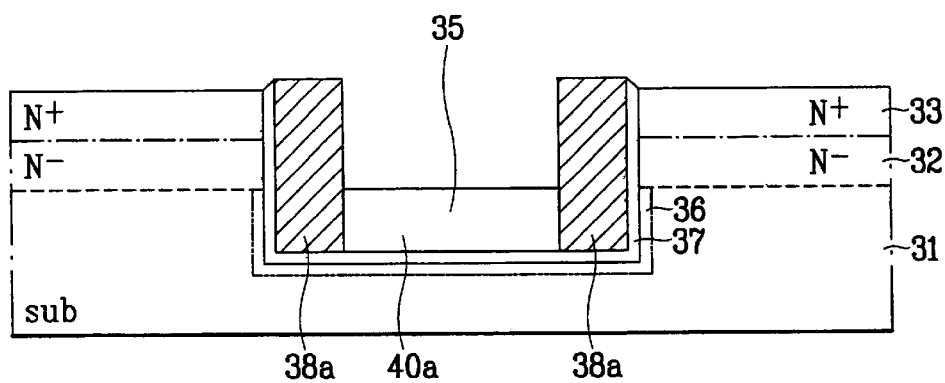
Figure 3J:
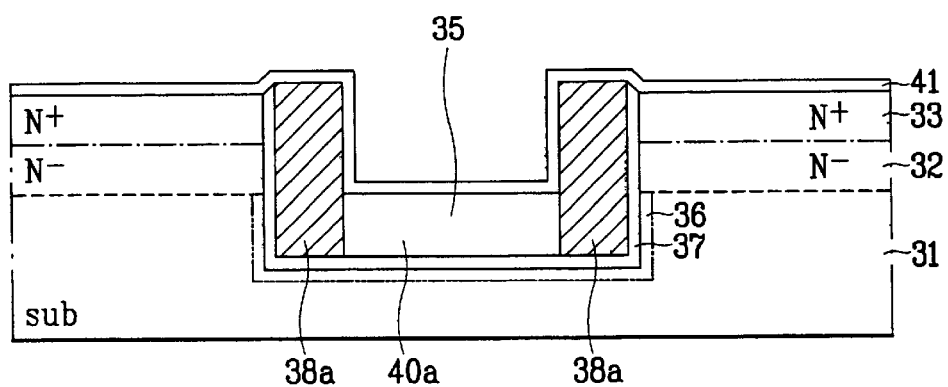
Figure 3K:
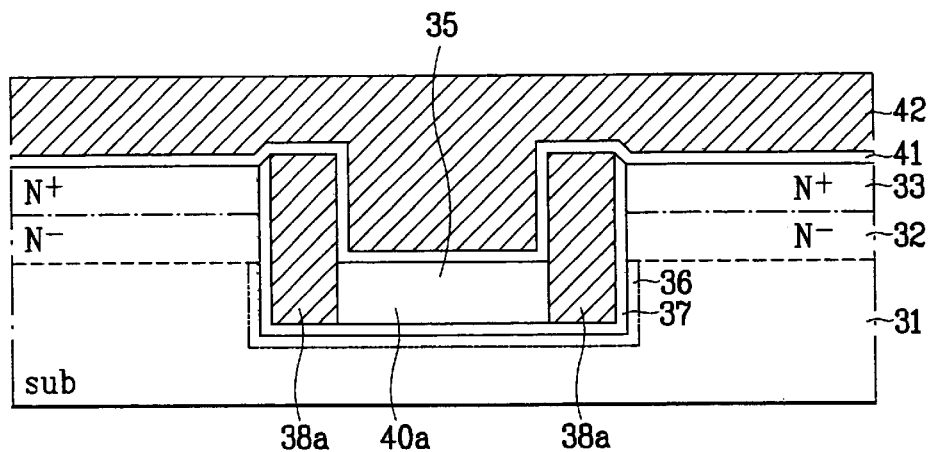
Figure 3L:
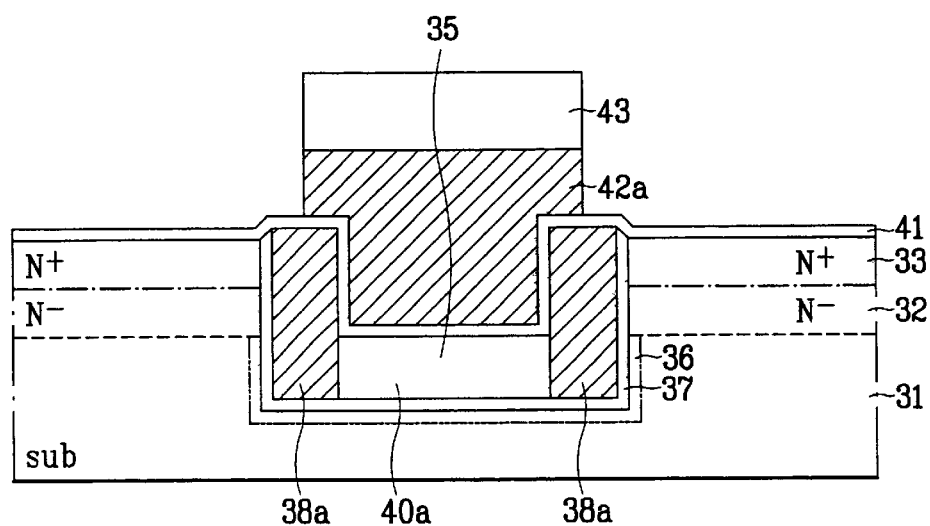
Figure 3M:
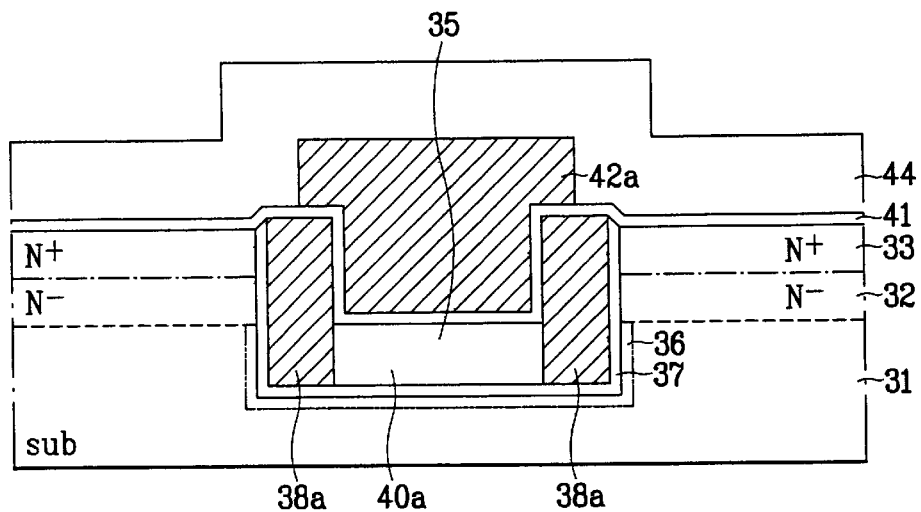
Figure 3N:
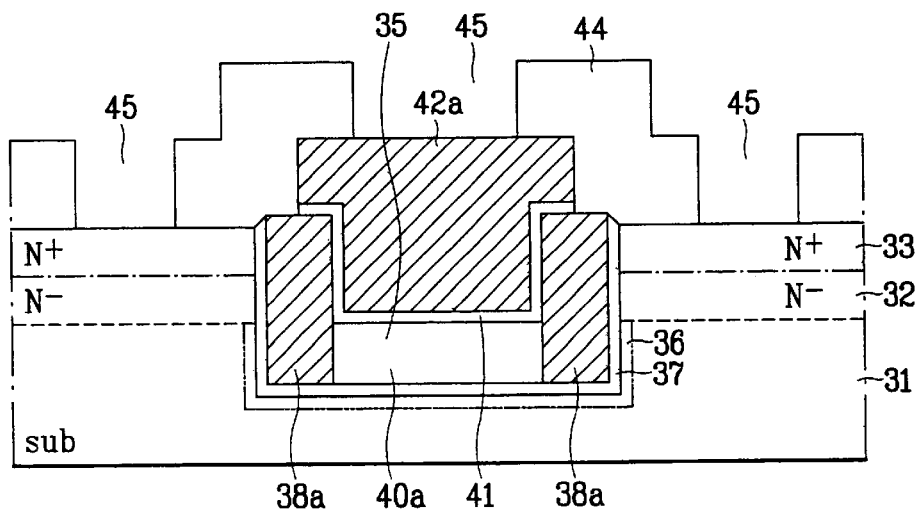
Figure 3O:
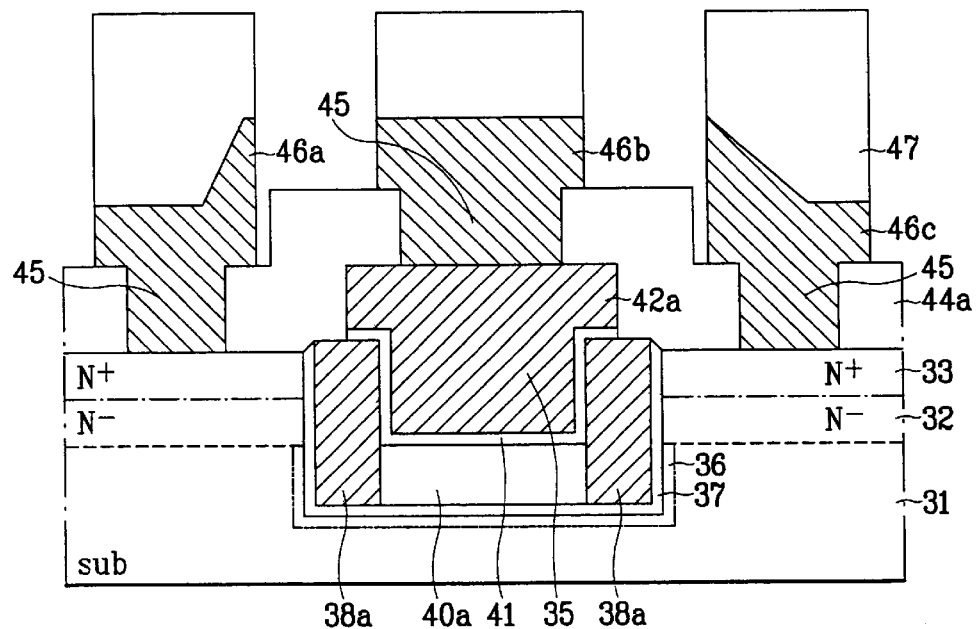
Figure 3P:
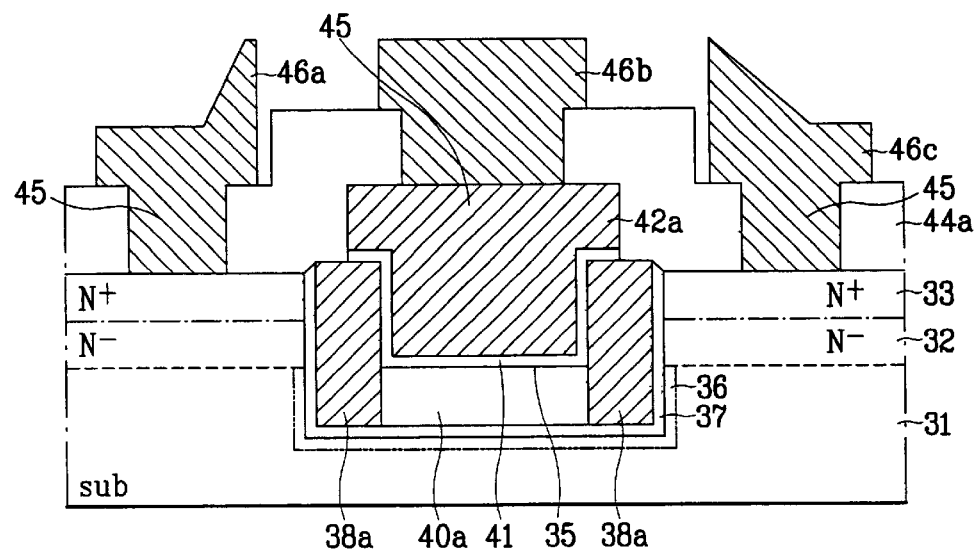

FIGS. 3A to 3P are sectional views illustrating process steps of a high voltage device according to an embodiment of the present invention.

As shown in FIG. 3P, a high voltage device according to the present invention includes a trench 35, a drift ion injection region 32, a source/drain ion injection region 33, a channel region 36, a first oxide film 37, a buffer polysilicon film 38a, a second oxide film 40a, a gate electrode 42a, a third oxide film 41, an interleaving insulating film 44a, a drain contact 46a, a gate contact 46b, and a source contact 46c. Trench 35 is formed in one region of semiconductor substrate 31 at a predetermined depth. Drift ion injection region 32 is formed on semiconductor substrate 31 at both sides of trench 35 at a first depth less than the depth of trench 35. Source/drain ion injection region 33 is formed in drift ion injection region 32 at a second depth less than the first depth. First oxide film 37 is formed on a surface of the semiconductor substrate 31 containing trench 35. Buffer polysilicon film 38a is formed on both sides of the trench 35. The second oxide film 40a is formed having a predetermined thickness on the first oxide film 37 below the trench 35. Gate electrode 42a is formed on trench 35 and buffer polysilicon film 38a adjacent to trench 35. The third oxide film 41 insulates gate electrode 42a from buffer polysilicon film 38a. The interleaving insulating film 44a is formed on the entire surface of semiconductor substrate 31. Drain contact 46a, gate contact 46b, and source contact 46c are in respective contact with drain ion injection region 33, gate electrode 42a, and source ion injection region 33 through interleaving insulating film 44a.

The second oxide film 40a is formed thickly so as to have voltage-resistant characteristics for protecting against a high voltage applied to the gate electrode 42a.

A method for fabricating the aforementioned high voltage device according to the present invention is now described.

As shown in FIG. 3A, an n-type (n−) lightly doped impurity ion is injected into a semiconductor substrate 31 at a first depth to form a drift ion injection region 32. An n-type (n+) heavily-doped impurity ion is injected into semiconductor substrate 31 at a second depth less than the first depth to form source and drain ion injection regions 33.

At this time, drain engineering is performed by adjusting the concentration of the n-type heavily-doped impurity ion so as to adapt to a desired high voltage. The source and drain ion injection regions 33 are thus formed.

As shown in FIG. 3B, a first photoresist 34 is deposited on semiconductor substrate 31 and then patterned by exposure and developing processes to partially expose one region of semiconductor substrate 31.

The exposed semiconductor substrate 31 is removed at a third depth greater than the first depth using patterned first photoresist 34 as a mask to form a trench 35. The first photoresist 34 is then removed.

Subsequently, as shown in FIG. 3C, a channel ion is injected into the entire surface of semiconductor substrate 31 to form a channel region 36 in semiconductor substrate 31 at a lower portion and sidewalls of trench 35.

At this time, a tilt ion injection process is utilized so that the channel ion is uniformly injected into the lower portion and the side of trench 35.

Subsequently, as shown in FIG. 3D, a first oxide film 37 is deposited on the entire surface of semiconductor substrate 31 including trench 35.

First oxide film 37 acts as a gate oxide film at the bottom and sidewalls of semiconductor substrate 31 in which trench 35 is formed.

As shown in FIG. 3E, a first polysilicon film 38 is deposited on the entire surface of semiconductor substrate 31 including trench 35. The first polysilicon film 38 is formed thickly to completely fill trench 35.

As shown in FIG. 3F, the first polysilicon film 38 is flattened by an etch-back process leaving first polysilicon film 38 within trench 35.

Afterwards, as shown in FIG. 3G, a second photoresist 39 is deposited on the entire surface of semiconductor substrate 31 and then patterned by exposure and developing processes to expose first polysilicon film formed in the center of trench 35.

In other words, second photoresist 39 is patterned so that first polysilicon film formed in both edges of trench 35 is masked by second photoresist 39.

First polysilicon film 38 is selectively removed by an etching process using the patterned second photoresist as a mask so that buffer polysilicon films 38a are formed at both sides of trench 35.

As shown in FIG. 3H, second photoresist 39 is removed and then a second oxide film 40 is deposited on the entire surface of semiconductor substrate 31 including trench 35 to form an insulating film 40. Insulating film 40 insulates buffer polysilicon films 38a formed at both sides of trench 35 from each other. Also, insulating film 40 acts as a channel oxide film.

As shown in FIG. 3I, second oxide film 40 is selectively removed by the etch-back process so that it remains at the lower portion of trench 35.

At this time, second oxide film 40a remaining at the lower portion of trench 35 is thickly formed to have voltage-resistant characteristics to protect against a voltage applied to a gate electrode which will be formed later.

As shown in FIGS. 3J and 3K, after a third oxide film 41 is deposited on the entire surface of semiconductor substrate 31, a second polysilicon film 42 is deposited on the entire surface of semiconductor substrate 31 including trench 35.

Subsequently, as shown in FIG. 3L, a third photoresist 43 is deposited on second polysilicon film 42 and then selectively patterned by exposure and developing processes to leave third photoresist 43 on second polysilicon film 42 formed between buffer polysilicon films 38a and a region adjacent to second polysilicon film 42.

Second polysilicon film 42 is selectively removed using patterned third photoresist 43 as a mask to form a gate electrode 42a. Third photoresist 43 is then removed.

As shown in FIGS. 3M and 3N, an interleaving insulating film 44 is formed on the entire surface of semiconductor substrate 31 and then selectively removed to expose source and drain ion injection regions 33 and an upper surface of gate electrode 42a. Thus, contact holes 45 are formed.

A boron phosphorus silicate glass (BPSG) film is used as interleaving insulating film 44.

As shown in FIG. 3O, a metal film is deposited on the entire surface including contact hole 45 and a fourth photoresist 47 is deposited on the metal film. Fourth photoresist 47 is then selectively patterned by exposure and developing processes to leave fourth photoresist 47 in contact holes 45 and on a region adjacent to contact holes 45. The metal film is selectively removed using patterned fourth photoresist 47 as a mask to respectively form a drain contact 46a, a gate contact 46b, and a source contact 46c.

As shown in FIG. 3P, fourth photoresist 47 is removed. Thus, the high voltage device according to the present invention is completed.

In the high voltage device according to the present invention, even if a high voltage is applied to gate electrode 42a, buffer polysilicon film 38a divides the high voltage to buffer it.

The high voltage device and the method for fabricating the same according to the present invention include the following advantages.

Since the buffer polysilicon film acts as a buffer film for the high voltage applied to the gate electrode, it is possible to improve voltage-resistant characteristics to protect the high voltage device. Accordingly, the high voltage device can be operated under a sufficient high voltage.

Furthermore, the high voltage device, having excellent voltage-resistant characteristics, can be fabricated by a simple process.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A high voltage device comprising:
   a semiconductor substrate having first, second and third regions, the first region having sidewalls at both sides, and the second and third regions located at a height higher than that of the first region and at both sides of the first region;
   a channel region formed within a surface of the substrate belonging to the first region including at least one of the sidewalls;
   a first insulating film formed on a surface of the first region including at least one of the sidewalls;
   buffer conductive films formed to be adjacent to the sidewalls of the first region and isolated from each other;
   a second insulating film formed between the buffer conductive films to have a recess portion;
   a third insulating film formed on an entire surface including the buffer conductive films;
   a gate electrode insulated from lower layers by the third insulating film to fill the recess portion and formed to partially overlap the buffer conductive films;
   drift regions respectively formed in the second and third regions to have a first depth; and
   source and drain regions formed in the second and third regions to have a second depth less than the first depth.

2. The high voltage device of claim 1, wherein the gate electrode has a lower surface defined by the second insulating film and the buffer conductive films and a flat upper surface flattened to have different thickness at a center and an edge portion.

3. The high voltage device of claim 1, further comprising another insulating film formed with contact holes on the gate electrode and the source and drain regions and a metal line contacted with the source and drain regions through the contact holes.

4. The high voltage device of claim 1, wherein the buffer conductive films have a height equal to or greater than the surface of the semiconductor substrate belonging to the second and third regions.

5. The high voltage device of claim 1, wherein the first depth is less than a step difference between the first region and the second and third regions.

6. The high voltage device of claim 1, wherein the recess portion of the second insulating film has a flat surface as a whole.

* * * * *